United States Patent
Senoo et al.

(10) Patent No.: US 7,593,266 B2
(45) Date of Patent: Sep. 22, 2009

(54) SEMICONDUCTOR MEMORY DEVICE AND METHOD OF VERIFYING THE SAME

(75) Inventors: Makoto Senoo, Yokohama (JP);
Kazunari Kido, Yokohama (JP);
Shunichi Toyama, Yokohama (JP);
Yoshihiro Tsukidate, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 237 days.

(21) Appl. No.: 11/819,173

(22) Filed: Jun. 26, 2007

(65) Prior Publication Data
US 2008/0123428 A1 May 29, 2008

(30) Foreign Application Priority Data
Jun. 26, 2006 (JP) ............... 2006-175550

(51) Int. Cl.
*G11C 11/34* (2006.01)
(52) U.S. Cl. ............... 365/185.22; 365/185.28
(58) Field of Classification Search ............ 365/185.22, 365/185.28, 185.29
See application file for complete search history.

(56) References Cited

U.S. PATENT DOCUMENTS

| | | | |
|---|---|---|---|
| 7,266,029 B2* | 9/2007 | Jeong | 365/207 |
| 7,342,830 B1* | 3/2008 | Chen et al. | 365/185.22 |
| 7,385,850 B2* | 6/2008 | Jeong et al. | 365/185.22 |
| 7,480,182 B2* | 1/2009 | Kim et al. | 365/185.22 |

FOREIGN PATENT DOCUMENTS

KR 10-2000-0023177 4/2000

* cited by examiner

Primary Examiner—Anh Phung
(74) Attorney, Agent, or Firm—Harness, Dickey & Pierce, P.L.C.

(57) ABSTRACT

Example embodiments provide a semiconductor memory device and a method of verifying the same. The semiconductor memory device may include: a memory including a plurality of memory cells; a verifier determining a program state of the memory cell in the memory; and/or an address/program controller controlling the memory and the verifier. Example embodiments include making the memory start a suspend operation during an operation of the memory cell, and/or starting a verify operation when the suspend operation terminates. The address/program controller may start the operation on the memory cell if it is determined that a repeat operation is necessary, and may start the program operation on the next memory cell if it is determined that a repeat operation is unnecessary. The memory operation mode may be one in which a verify operation is not performed before programming.

8 Claims, 5 Drawing Sheets

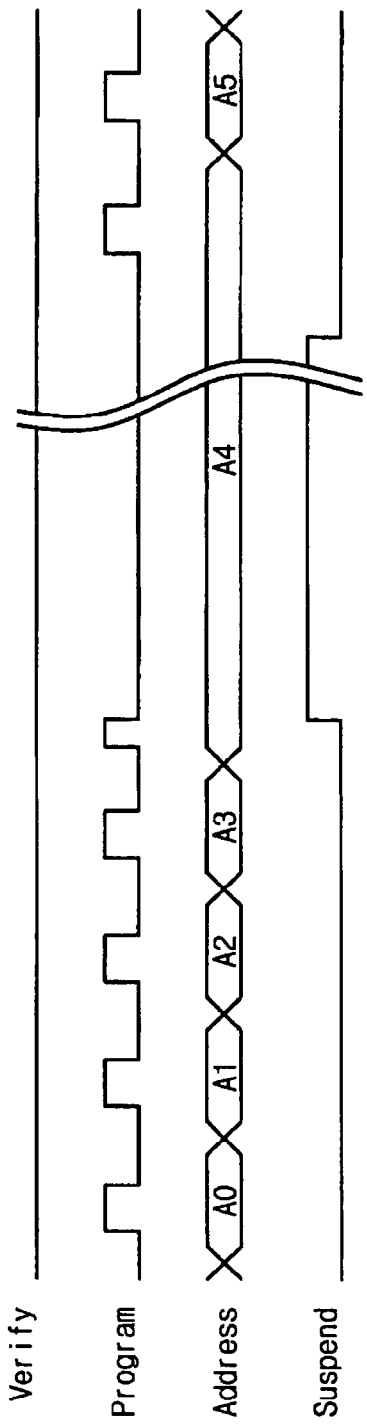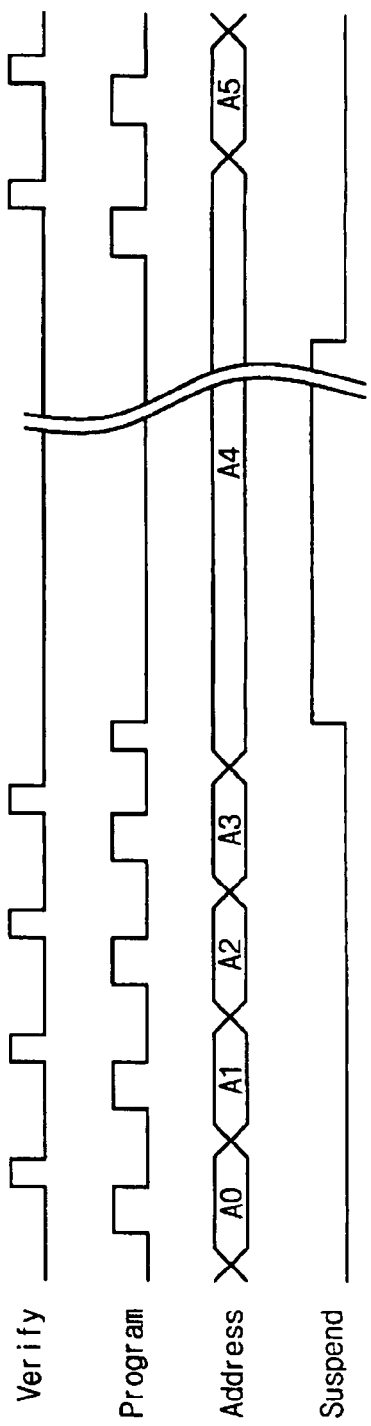

SEMICONDUCTOR MEMORY DEVICE AND METHOD OF VERIFYING THE SAME

PRIORITY STATEMENT

This U.S. non-provisional patent application claims priority under 35 U.S.C. § 119 of Japanese Patent Application No. 2006-175550, filed on Jun. 26, 2006, the entire contents of which are hereby incorporated by reference.

BACKGROUND

Example embodiments relate to a semiconductor memory device, for example, to a flash memory device and a method of verifying the same.

FIGS. 4a and 4b are timing diagrams illustrating one suspend during a program operation of a conventional memory, for example, flash memory. FIG. 4a illustrates a case where a verify operation is not performed after programming. FIG. 4b illustrates a case where a verify operation is performed after programming. FIGS. 4a and 4b are based on an operation mode in which a verify operation is not performed before programming. Referring to FIG. 4a, program operations for memory cells corresponding to addresses A0 to A3 sequentially proceed. However, when a suspend occurs during a program operation of a memory cell corresponding to an address A4, the program operation terminates. The program operation starts again from the point of when the program operation terminated, and the program operation is performed on the memory cell of the address A4. Then, program operation proceeds to an address A5, and a program operation is performed on a memory cell of the address A5.

Referring to FIG. 4b, program operations for memory cells corresponding to addresses A0 to A3 are sequentially performed and then respective verify operations are performed. When a suspend occurs during a program operation for a memory cell corresponding to an address A4, the program operation terminates. The program operation starts again from the point of when the program operation terminated, and then a verify operation is performed on the memory cell of the address A4. If it is determined that rewrite is unnecessary by using the verify operation, program operation proceeds to an address A5, and then a program operation is performed on a memory cell corresponding to the address A5.

According to the above description, a voltage stress is again applied to a memory cell of the same address by a program operation after resuming the program operation like all cases of FIGS. 4a and 4b.

FIGS. 5a and 5b are timing diagrams illustrating a plurality of suspends during a program operation of a conventional memory, for example, flash memory. FIG. 5a illustrates a case where a verify operation is not performed after programming. FIG. 5b illustrates a case where a verify operation is performed after programming. FIGS. 5a and 5b are based on an operation mode in which a verify operation is not performed before programming. Referring to FIG. 5a, a program operation for memory cells corresponding to addresses A0 to A3 sequentially proceeds. However, when a suspend occurs during a program operation for a memory cell corresponding to an address A4, the program operation terminates. The program operation starts again from the point of when the program operation terminated, and the program operation is again performed on the memory cell of the address A4. However, a suspend occurs again in the memory cell corresponding to the address A4 during the resumed program operation, such that these operations repeat several times. When the suspend terminates finally, a program operation is performed on a memory cell corresponding to the address A4 again, and then program operation proceeds to an address A5. Then, a program operation is performed on a memory cell of the address A5.

Referring to FIG. 5b, a program operation for memory cells corresponding to addresses A0 to A3 is performed and then a verify operation is performed. When a suspend occurs during a program operation for a memory cell corresponding to an address A4, the program operation terminates. The program operation starts again from the point of when the program operation terminates, and then a verify operation is performed on the memory cell of the address A4. If it is determined that rewrite is unnecessary through the verify operation, program operation proceeds to an address A5, and then a program operation is performed on a memory cell corresponding to the address A5. A voltage stress is again applied to a memory cell of the same address by means of a plurality of program operations after resuming the program operation like all cases of FIGS. 4a and 4b.

In a case of FIGS. 5a and 5b, a plurality of suspends during program operations continuously occur without one verify operation, such that voltage stresses of a plurality of program operations accumulate in a memory cell. Accordingly, this may cause voltage overstress in a memory cell. In a case of FIGS. 4a and 4b, voltage stress by a program operation, which is applied to a memory cell of the address A4, increases by one, but a plurality of voltage stresses accumulates for a long time as illustrated in FIGS. 5a and 5b.

SUMMARY

Example embodiments provide a method for verifying a memory in order to prevent voltage overstress without a verify operation before programming a memory, for example, a flash memory device. The voltage overstress may be caused through a program operation of a memory cell in a memory operation mode. The voltage overstress may be also be caused through an erase operation of a memory cell in a memory operation mode.

Example embodiments provide semiconductor memory devices including, but not limited to: a memory including a plurality of memory cells; a verifier determining a state of the memory cell in the memory; and/or an address/program controller controlling the memory and the verifier. Example embodiments include making the memory start a suspend operation during an operation of the memory cell, and/or starting a verify operation when the suspend operation terminates. The address/program controller may start the operation on the memory cell if it is determined that a repeat operation is necessary, and may start the operation on the next memory cell if it is determined that a repeat operation is unnecessary. The memory operation mode may be a memory operation mode in which a verify operation is not performed before programming.

Other example embodiments include methods of verifying a memory, the methods including: determining whether a suspend operation may or may not start during an operation on a memory cell; stopping the operation when the suspend operation starts; starting a verify operation when the operation is completed on the memory cell or the suspend operation is terminated; resuming the operation if it is determined that a repeat operation may be necessary during the verify operation; performing the operation on a memory cell of the next address if it is determined that a repeat operation is unnecessary; and terminating the operation when an address of the memory cell is final. The memory operation mode may be a memory operation mode in which a verify operation is not performed before programming.

In example embodiments, a memory operation mode of the memory is a memory operation mode in which a verify operation is not performed before programming.

In example embodiments, the state is a program state, the operation is a program operation, and the repeat operation is a rewrite operation.

In example embodiments, the state is an erase state, the operation is an erase operation, and the repeat operation is a re-erase operation.

BRIEF DESCRIPTION OF THE FIGURES

The accompanying figures are included to provide a further understanding of example embodiments and are incorporated in and constitute a part of this specification. The drawings illustrate example embodiments and, together with the description, serve to explain principles of example embodiments. In the figures:

FIGS. 4a and 4b are timing diagrams illustrating one suspend during a program operation of a conventional flash memory.

DETAILED DESCRIPTION OF EXAMPLE EMBODIMENTS

Figure 1:
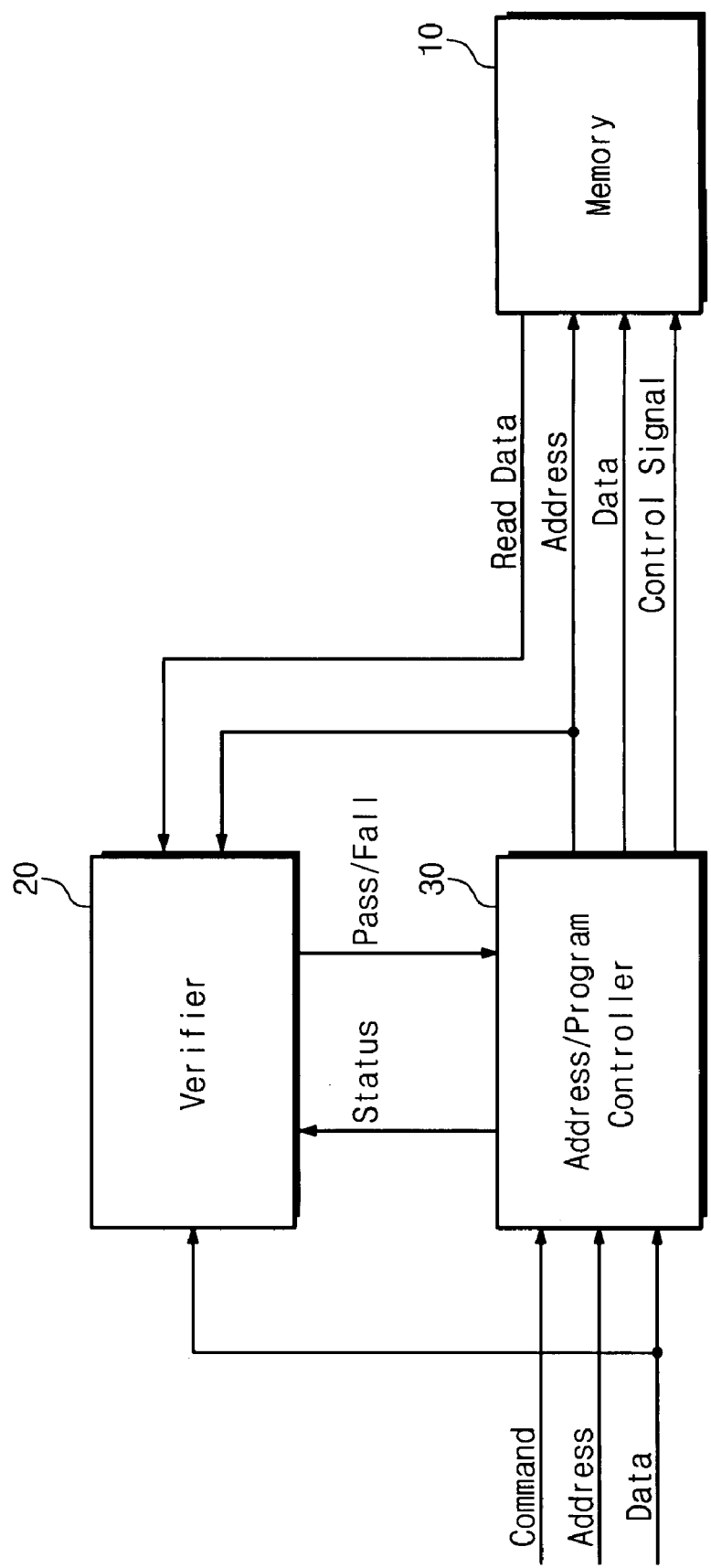
FIG. 1 is a block diagram of a semiconductor memory device according to example embodiments.

Example embodiments will be more clearly understood from the detailed description taken in conjunction with the accompanying drawings.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Various example embodiments will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although example embodiments have been disclosed for illustrative purposes, those skilled in the art will appreciate that various modifications, additions and substitutions are possible, without departing from the scope and spirit of the invention as disclosed in the accompanying claims.

Example embodiments will be described below in more detail with reference to the accompanying drawings. Example embodiments may, however, be embodied in different forms and should not be construed as limited to the embodiments set forth herein. Rather, these example embodiments are provided so that this disclosure will be thorough and complete, and will fully convey the scope of the present invention to those skilled in the art.

Hereinafter, example embodiments will be described in conjunction with the accompanying drawings.

FIG. 1 is a block diagram of a semiconductor memory device according to example embodiments. Referring to FIG. 1, an address/program controller 30 may receive various commands, addresses, and/or data from CPU (not shown) that may control a memory 10 during a memory operation mode in which a verify operation is not performed before programming. The various commands may include a program command, a suspend command, and/or a resume command. The address/program controller 30 may provide a control signal, an address, and/or data, which are generated according to the various commands, to the memory 10. The control signal may include a program operation signal, a suspend operation signal, and/or a verify operation signal.

The memory 10 may include a memory cell array having a plurality of memory cells. The memory cell array may include a row decoder and/or a column decoder, which may select memory cells. Additionally, various gates (not shown) may respond to a control signal based on various commands and may perform operations on selected memory cells. The memory 10 may receive an operate signal, e.g., one of control signals, an address, and/or data, and may program data in a memory cell of the assigned address.

The address/program controller 30 may perform an operation corresponding to a program command on the memory 10, and may receive a suspend command during the operation. At this point, the address and data may be recorded simultaneously, a status signal notifying suspend may be delivered to a verifier 20, and a suspend operation signal may be delivered to the memory 10, thereby stopping a program operation. The verifier 20 may record an address and data identically when receiving a status signal corresponding to suspend.

The address/program controller 30 may transmit a status signal notifying the verifier 20 when receiving a resume command followed by a suspend command, and may also transmit a verify operation signal and/or a recorded address into the memory 10. The memory 10 may read data from a memory cell of the received address and may transmit the data into verifier 20. The verifier 20 may combine the previously recorded address and data with an address that the address/program controller 30 may transmit to the memory 10 and received data from the memory 10 when receiving a status signal corresponding to verify. A pass signal may be generated by the verifier 20 when the combination is identical, or a fail signal may be generated by the verifier 20 when the combination is not identical and transmitted to the address/program controller 30.

The address/program controller 30 may transmit a program operation signal and previously recorded address and/or data into the memory 10 by determining that rewrite is necessary in the memory cell when receiving a fail signal. This operation may repeat until the address/program controller 30 receives a pass signal. If the address/program controller 30 determines that rewrite may be unnecessary when receiving a pass signal, the address/program controller 30 may transmit an address, data, and/or program operation signal of the next memory cell into the memory 10 in order to perform a program operation of the next memory cell. A portion or all functions of the address/program controller 30 and the verifier 20 may be performed by the CPU that controls the entire memory 10.

Figure 2A:
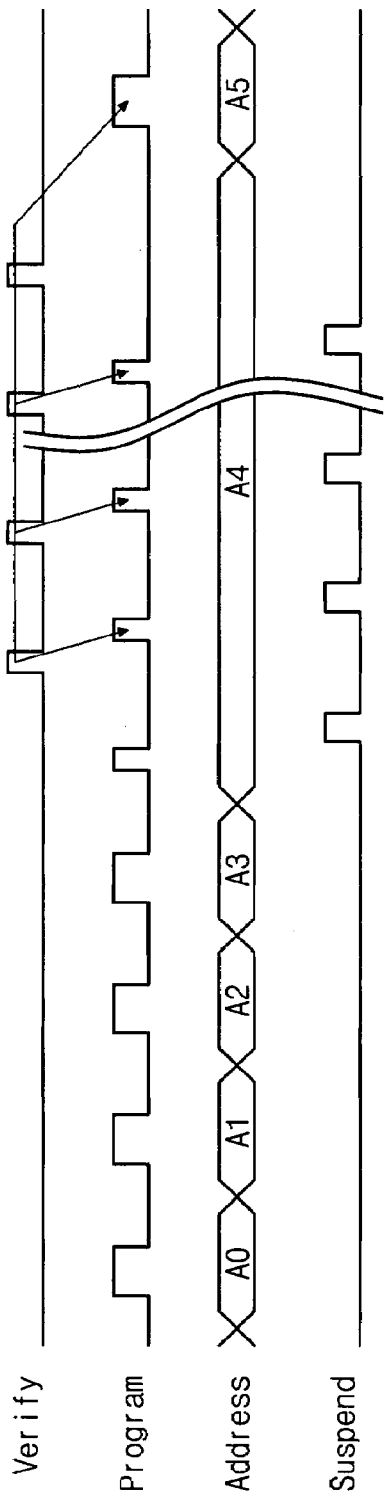
FIG. 2 is a timing diagram of a plurality of suspends during a program operation according to example embodiments.
Figure 2B:
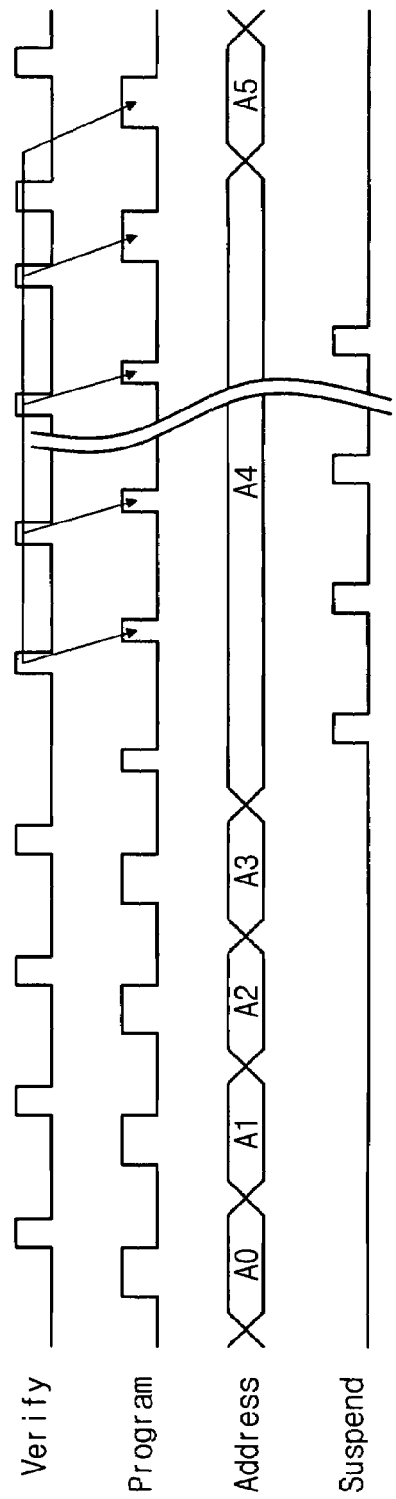

FIGS. 2a and 2b are timing diagrams of a plurality of suspends during a program operation. FIG. 2a illustrates a case where a verify operation is not performed after programming. FIG. 2b illustrates a case where a verify operation is performed after programming. Referring to FIG. 2a, program operations for memory cells corresponding to addresses A0 to A3 sequentially proceed. When a suspend occurs during a program operation for a memory cell corresponding to an address A4, the program operation may terminate. A verify operation may start again from the point of when the program operation terminated, and a rewrite operation may again be performed on the memory cell of the address A4 if a combination result is a fail signal. However, a suspend may occur again in the memory cell corresponding to the address A4 during the rewrite operation, such that these operations may repeat several times. When a verify operation is performed at a point of when suspend terminates and a pass signal is outputted if the combination result is a pass signal during the verify operation, the program operation may proceed to the next address A5.

Referring to FIG. 2b, program operations for memory cells corresponding to addresses A0 to A3 may be sequentially performed and then respective verify operations may be performed. When a suspend occurs during a program operation for a memory cell corresponding to an address A4, the program operation may terminate. A verify operation may start again from the point of when the program operation terminates, and a rewrite operation may be performed on the memory cell of the address A4 if the combination result is a fail signal. However, a suspend may occur again in the memory cell corresponding to the address A4 during the rewrite operation, such that these operations may repeat several times. When a verify operation is performed at a point of when the suspend terminates and a fail signal may be outputted because the combination result is still a fail signal during the verify operation, a rewrite function may be performed on the memory cell of the address A4. If the combination is the same during the verify operation, a pass signal may be outputted and the program operation may proceed to the next address A5.

According to FIGS. 2a and 2b, when the combination is the same according to the verify operation after an initial suspend operation, the program operation may proceed to an address A5. When the combination result is the same according to the verify operation after a second suspend operation, the program operation may proceed to the address A5. In either case, the next suspend operation may be performed on a memory cell followed by the address A5, and the memory cell of the address A4 may prevent a voltage overstress by reducing or minimizing a voltage stress of the memory cell in the address A4.

Figure 3:
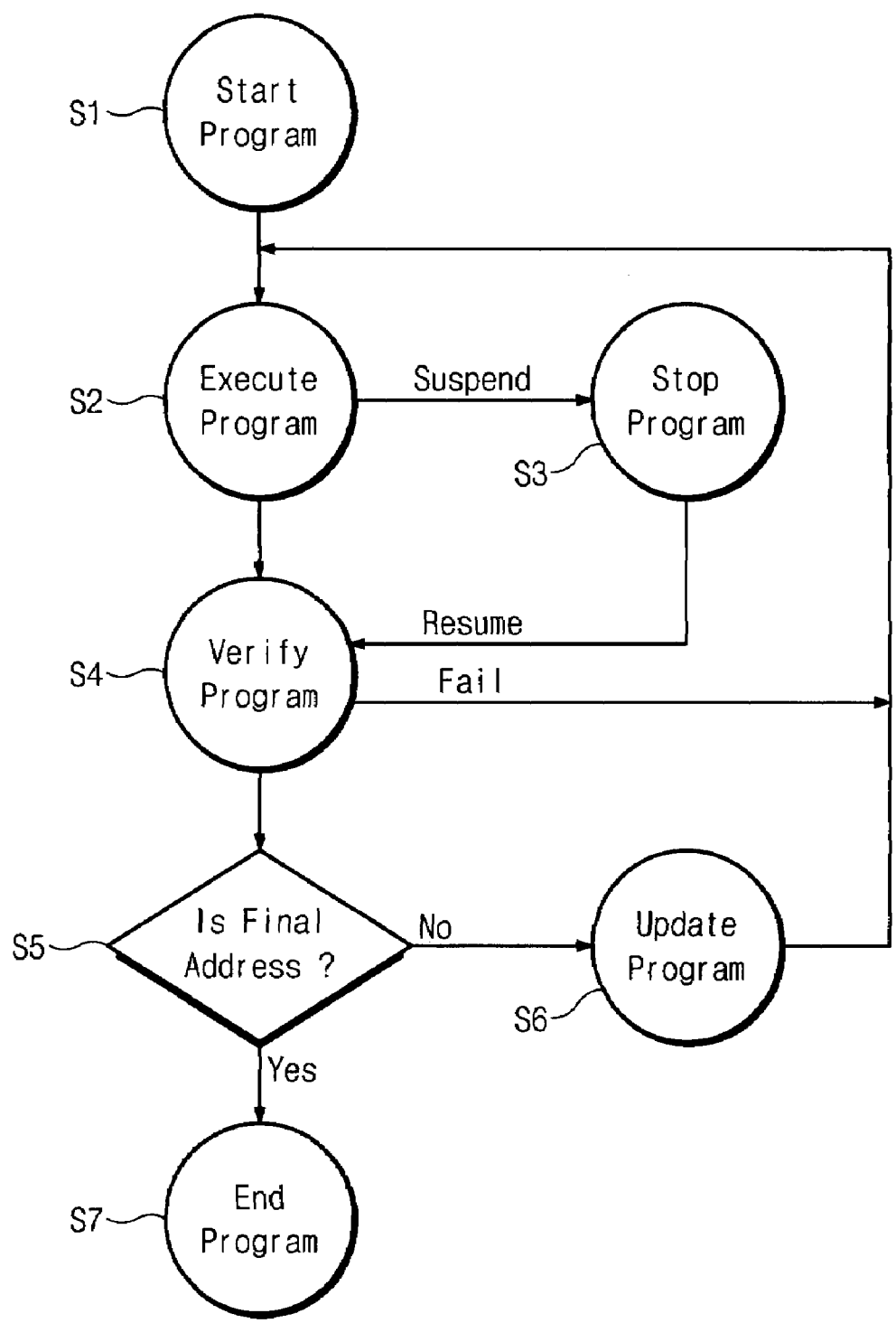
FIG. 3 is a state transition diagram illustrating a method of verifying a semiconductor memory device according to example embodiments.
Figure 5A:
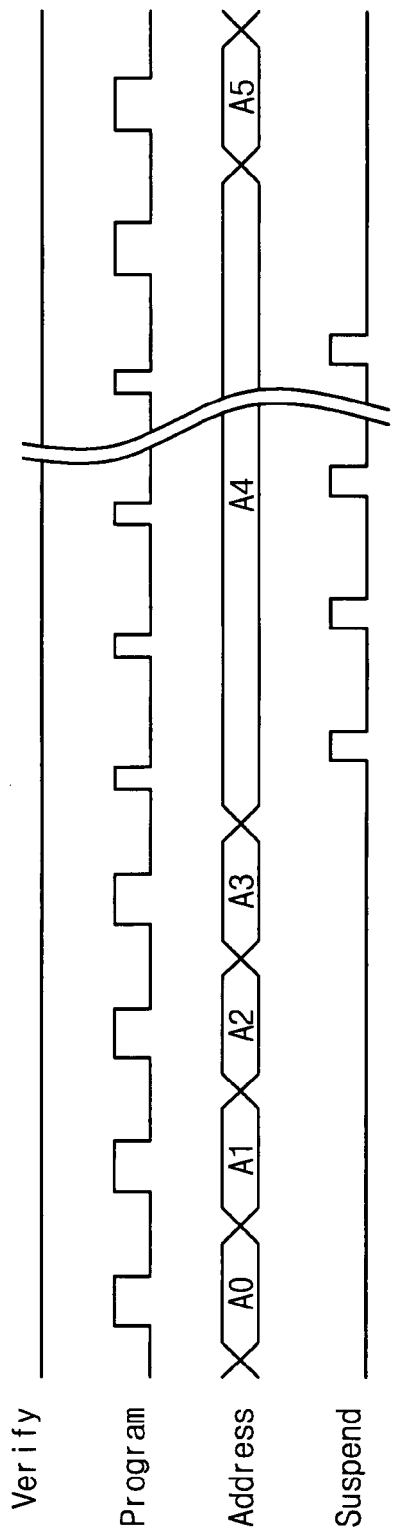
FIGS. 5a and 5b are timing diagrams illustrating a plurality of suspends during a program operation of a conventional flash memory.
Figure 5B:
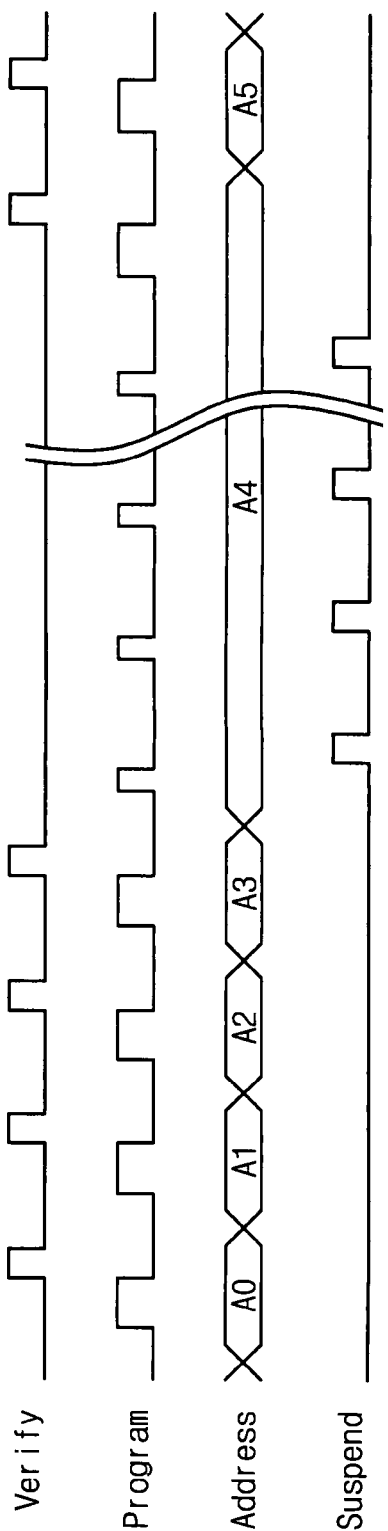

FIG. 3 is a state transition diagram illustrating a method of verifying a semiconductor memory device according to example embodiments. In operations S1 and S2, a program operation of a memory cell may start in a memory operation mode in which a verify operation is not performed before programming, and it is determined whether a suspend operation may or may not start during the program operation. In operation S3, when the suspend operation starts, a program operation may terminate. In operation S4, when a program operation for a memory cell is completed or a suspend operation is terminated, a fail signal may be outputted. If it is determined that rewrite may be necessary in a memory cell, a program operation for a memory cell may resume in operation S2. If a rewrite is unnecessary, it is determined whether the address is final or not in operation S5. When the address is not final, the address may be updated, and then a program operation is performed on a memory cell of the next address in operations S6 and S2, and when an address is final, a program operation may terminate in operation S7.

As described above, according to a method of verifying a memory of example embodiments, a voltage stress of a memory cell, which may be applied during a program operation, may be reduced or minimized, such that increase of cell erasing time, deterioration of data maintenance property, and/or memory cell damage due to a voltage overstress may be reduced or prevented. Moreover, if it is determined that rewrite is unnecessary, a program operation may proceed to the next address without unnecessary operations, thereby reducing programming time.

According to the above example embodiments, a voltage overstress due to a program operation of a memory cell may be reduced or prevented in a memory operation mode in which a verify operation is not performed before programming. Therefore, an increase of cell erasing time, deterioration of data maintenance property, and/or memory cell damage due to a voltage overstress may be reduced or prevented. Moreover, if it is determined that rewrite is unnecessary, a program operation may proceed to the next address without unnecessary operations, thereby reducing programming time.

Although example embodiments are described in conjunction with a program operation, teachings of example embodiments may be applied to other operations, for example, an erase operation. Japanese Pat. No. 2004-348808 discloses a semiconductor memory device capable of stopping an erase operation for a memory cell array having a memory, and resuming the erase operation and the entire contents thereof are hereby incorporated by reference.

The above-disclosed subject matter is to be considered illustrative, and not restrictive, and the appended claims are intended to cover all such modifications, enhancements, and other example embodiments, which fall within the true spirit and scope of example embodiments. Thus, to the maximum extent allowed by law, the scope of example embodiments are to be determined by the broadest permissible interpretation of the following claims and their equivalents, and shall not be restricted or limited by the foregoing detailed description.

What is claimed is:

1. A semiconductor memory device comprising:
   a memory including a plurality of memory cells;
   a verifier determining a state of the memory cell in the memory; and
   an address/program controller controlling the memory and the verifier, making the memory start a suspend operation during an operation of the memory cell, and starting a verify operation when the suspend operation terminates,
   wherein the address/program controller starts the operation on the memory cell if it is determined that a repeat operation is necessary, and starts the program operation on the next memory cell if it is determined that the repeat operation is unnecessary.

2. The semiconductor memory device of claim 1, wherein a memory operation mode of the semiconductor memory device is a memory operation mode in which a verify operation is not performed before programming.

3. The semiconductor memory device of claim 1, wherein the state is a program state, the operation is a program operation, and the repeat operation is a rewrite operation.

4. The semiconductor memory device of claim 1, wherein the state is an erase state, the operation is an erase operation, and the repeat operation is a re-erase operation.

5. A method of verifying a memory, the method comprising:
   determining whether a suspend operation starts or not during an operation on a memory cell;
   stopping the program operation when the suspend operation starts;
   starting a verify operation when the operation is completed on the memory cell or the suspend operation is terminated;
   resuming the operation if it is determined that a repeat operation is necessary during the verify operation;
   performing the operation on a memory cell of the next address if it is determined that the repeat operation is unnecessary; and
   terminating the program operation when a last address of the memory is reached.

6. The method of claim 5, wherein a memory operation mode of the memory is a memory operation mode in which a verify operation is not performed before programming.

7. The method of claim 5, wherein the state is a program state, the operation is a program operation, and the repeat operation is a rewrite operation.

8. The method of claim 5, wherein the state is an erase state, the operation is an erase operation, and the repeat operation is a re-erase operation.

* * * * *